US010696082B2

(12) United States Patent
Shigeta

(10) Patent No.: US 10,696,082 B2
(45) **Date of Patent: *Jun. 30, 2020**

(54) FULL-AUTOMATIC GRAVURE PLATE-MAKING PROCESSING SYSTEM

(75) Inventor: Tatsuo Shigeta, Kashiwa (JP)

(73) Assignee: THINK LABORATORY CO., LTD., Chiba (JP)

( * ) Notice: Subject to any disclaimer, the term of this patent is extended or adjusted under 35 U.S.C. 154(b) by 964 days.

This patent is subject to a terminal disclaimer.

(21) Appl. No.: 13/820,607

(22) PCT Filed: Sep. 27, 2011

(86) PCT No.: PCT/JP2011/071962

§ 371 (c)(1),
(2), (4) Date: Mar. 4, 2013

(87) PCT Pub. No.: WO2012/043515

PCT Pub. Date: Apr. 5, 2012

(65) Prior Publication Data

US 2013/0160947 A1 Jun. 27, 2013

(30) Foreign Application Priority Data

Oct. 1, 2010 (JP) ................................ 2010-223936

(51) Int. Cl.
*B41N 1/10* (2006.01)
*B41C 1/02* (2006.01)
(Continued)

(52) U.S. Cl.
CPC ................ *B41N 1/10* (2013.01); *B41C 1/025* (2013.01); *B41C 1/18* (2013.01); *B41N 3/003* (2013.01)

(58) Field of Classification Search
CPC ........... B41N 3/003; B41C 1/18; B41C 1/025; B05C 11/10; H01L 21/67167
See application file for complete search history.

(56) References Cited

U.S. PATENT DOCUMENTS 5,822,078 A * 10/1998 Hirai ......................... B41C 1/18 358/3.32
6,017,820 A * 1/2000 Ting ...................... C23C 14/568 156/345.32

(Continued)

FOREIGN PATENT DOCUMENTS

EP 1 449 649 A2 8/2004
EP 1 642 713 A1 4/2006

(Continued)

OTHER PUBLICATIONS

Convertech, Aug. 15, 2010, vol. 38, No. 8, pp. 12-13.

*Primary Examiner* — Charlee J. C. Bennett
(74) *Attorney, Agent, or Firm* — McGlew and Tuttle, P.C.

(57) ABSTRACT

Provided is a fully automatic gravure plate-making processing system capable of manufacturing a gravure plate-making roll more quickly as compared to a conventional case, achieving space saving, performing an unattended operation even in the nighttime, and reducing dust between individual processes. The fully automatic gravure plate-making processing system includes: a first industrial robot for chucking and handling an unprocessed plate-making roll; a second industrial robot for chucking and handling the unprocessed plate-making roll; a roll stock apparatus, a photosensitive film coating apparatus, a laser exposure apparatus, an ultrasonic cleaning apparatus with a drying function, a grinding wheel polishing apparatus, and a paper polishing apparatus, which serve as processing apparatus arranged in a handling area of the first industrial robot; and a degreasing apparatus, a copper plating apparatus, a developing apparatus, an etching apparatus, a resist removal apparatus, a surface hardening film forming apparatus, and an ultrasonic cleaning apparatus, which serve as processing apparatus arranged (Continued)

in a handling area of the second industrial robot, to thereby perform plate-making processing.

20 Claims, 3 Drawing Sheets

(51) Int. Cl.

| | |
|---|---|
| ***B41C 1/18*** | (2006.01) |
| ***B41N 3/00*** | (2006.01) |
| ***H01L 21/67*** | (2006.01) |

(56) References Cited

U.S. PATENT DOCUMENTS

| | | | | |
|---|---|---|---|---|
| 6,352,467 | B1 * | 3/2002 | Somekh | H01L 21/67751 451/28 |
| 7,194,791 | B2 * | 3/2007 | Shigeta et al. | 29/33 R |
| 7,396,448 | B2 * | 7/2008 | Inoue | B41N 3/034 205/151 |
| 8,867,101 | B2 * | 10/2014 | Shigeta | B41C 1/00 101/463.1 |
| 2008/0202687 | A1 * | 8/2008 | Smith | H01L 21/67126 156/345.32 |
| 2015/0014154 | A1 * | 1/2015 | Shigeta | C25D 21/18 204/239 |

FOREIGN PATENT DOCUMENTS

| | | | |
|---|---|---|---|
| EP | 2 556 960 | A1 | 2/2013 |
| JP | 10-193551 | A | 7/1998 |
| JP | 2002-127369 | A | 8/2002 |
| JP | 2004-243536 | A | 2/2004 |
| JP | 2004-223751 | A | 8/2004 |
| JP | 2004-225111 | A | 8/2004 |
| JP | 2004-232028 | A | 8/2004 |
| JP | 2008-221589 | A | 9/2008 |
| WO | WO 2007/135898 | | 11/2007 |
| WO | WO 2007/135899 | | 11/2007 |
| WO | WO 2007135899 | A1 * | 11/2007 |
| WO | 2011/125926 | A1 | 10/2011 |

* cited by examiner

FULL-AUTOMATIC GRAVURE PLATE-MAKING PROCESSING SYSTEM

TECHNICAL FIELD

The present invention relates to a gravure plate-making processing system, and more particularly, to a fully automatic gravure plate-making processing system capable of performing an unattended operation even in the nighttime.

BACKGROUND ART

Conventionally, gravure plate-making plants described in Patent Documents 1 to 6 have been known.

As can be seen from the drawings of Patent Documents 1 to 3, a manufacturing line for a gravure plate-making roll has conventionally been constructed of an industrial robot and a stacker crane used in combination.

In the manufacturing line using the stacker crane, processing is performed in each of various processing units under a state in which a plate-making roll to be processed (hereinafter referred to as "unprocessed plate-making roll") is chucked at the stacker crane with use of a cassette-type roll chuck rotary transportation unit.

However, in the case of such a manufacturing line using the stacker crane, the unprocessed plate-making roll is sequentially transferred to the various processing units under the state in which the unprocessed plate-making roll is chucked with use of the cassette-type roll chuck rotary transportation unit, and hence there arises a problem in that a longer time period is required accordingly.

In addition, in the case of the manufacturing line using the stacker crane, the unprocessed plate-making roll is sequentially transferred to the processing units under the state in which the unprocessed plate-making roll is chucked with use of the cassette-type roll chuck rotary transportation unit, and hence there arises a problem in that the various processing units need to be juxtaposed to one another and thus a large installation space is required therefor.

Further, in the case of the manufacturing line using the stacker crane, the unprocessed plate-making roll is sequentially transferred to the various processing units under the state in which the unprocessed plate-making roll is chucked with use of the cassette-type roll chuck rotary transportation unit, and hence there arises another problem in that dust may be generated.

PRIOR ART DOCUMENTS

Patent Documents

Patent Document 1: JP Hei 10-193551 A
Patent Document 2: WO 2007/135898
Patent Document 3: WO 2007/135899
Patent Document 4: JP 2004-223751 A
Patent Document 5: JP 2004-225111 A
Patent Document 6: JP 2004-232028 A
Patent Document 7: JP 2008-221589 A
Patent Document 8: JP 2002-127369 A

SUMMARY OF THE INVENTION

Problem to be Solved by the Invention

The present invention has been made in view of the above-mentioned circumstances of the conventional technologies, and it is therefore an object thereof to provide a fully automatic gravure plate-making processing system capable of manufacturing a gravure plate-making roll more quickly as compared to a conventional case, achieving space saving, performing an unattended operation even in the nighttime, and reducing dust between individual processes.

Means for Solving Problem

In order to solve the above-mentioned problems, according to the present invention, there is provided a fully automatic gravure plate-making processing system, including: a first industrial robot for chucking and handling an unprocessed plate-making roll; a second industrial robot for chucking and handling the unprocessed plate-making roll; a roll stock apparatus, a photosensitive film coating apparatus, a laser exposure apparatus, an ultrasonic cleaning apparatus with a drying function, a grinding wheel polishing apparatus, and a paper polishing apparatus, which serve as processing apparatus arranged in a handling area of the first industrial robot; and a degreasing apparatus, a copper plating apparatus, a developing apparatus, an etching apparatus, a resist removal apparatus, a surface hardening film forming apparatus, and an ultrasonic cleaning apparatus, which serve as processing apparatus arranged in a handling area of the second industrial robot, in which the first industrial robot and the second industrial robot are configured to transfer the unprocessed plate-making roll therebetween to perform plate-making processing.

In this manner, the unprocessed plate-making roll is transferred between the first industrial robot and the second industrial robot, and thus the gravure plate-making roll can be manufactured more quickly as compared to the conventional manufacturing line for a gravure plate-making roll using a stacker crane. Further, the unprocessed plate-making roll is transferred between the first industrial robot and the second industrial robot, and hence the stacker crane becomes unnecessary, which leads to such an advantage that space saving can be achieved. Further, the series of processing can be performed fully automatically based on predetermined programs, and hence there is also such an advantage that an unattended operation can be performed even in the nighttime. Further, the generation of dust can be prevented more reliably as compared to the case of using the stacker crane.

Further, it is preferred that the fully automatic gravure plate-making processing system further include a roll transfer placement table provided at a position at which the handling area of the first industrial robot overlaps with the handling area of the second industrial robot, that the ultrasonic cleaning apparatus with a drying function be provided in proximity to the roll transfer placement table, that, in the handling area of the first industrial robot, the grinding wheel polishing apparatus and the paper polishing apparatus, the roll stock apparatus, and the photosensitive film coating apparatus and the laser exposure apparatus be arranged in this order clockwise with respect to a position of the ultrasonic cleaning apparatus with a drying function, that the developing apparatus be provided in proximity to the roll transfer placement table, that, in the handling area of the second industrial robot, the etching apparatus and the resist removal apparatus, the surface hardening film forming apparatus and the ultrasonic cleaning apparatus, and the copper plating apparatus and the degreasing apparatus be arranged in this order clockwise with respect to a position of the developing apparatus, and that the first industrial robot and the second industrial robot be configured to transfer the unprocessed plate-making roll therebetween to perform the plate-making processing.

Through the arrangement as described above, it is possible to achieve higher work efficiency due to the reduction in movement time between the individual processes, and to achieve further space saving.

Further, the following configuration may be employed: that is, an IC tag that is wirelessly readable and writable is attached to the unprocessed plate-making roll, and a main computer for managing roll stock and plate-making that checks the record on the IC tag and outputs necessary signals to the individual roll processing apparatus for processing the roll, thereby assigning desired works to the individual roll processing apparatus. Further, a record of completion of the processing is written onto the IC tag and also recorded onto the main computer, thereby managing the process from the roll stock to the plate-making method and shipment. As such a technology of managing the process from the roll stock to the plate-making method and shipment with use of an IC tag that is wirelessly readable and writable, the technology disclosed in, for example, Patent Document 8 may be employed.

One or both of the processing rooms, in which the first industrial robot and the second industrial robot are arranged, may be set as clean rooms. Accordingly, the generation of dust can further be reduced.

It is preferred that the surface hardening film forming apparatus be a chromium plating apparatus, a DLC film forming apparatus, or a silicon dioxide film forming apparatus. For example, the diamond-like carbon (DLC) film forming apparatus for forming a DLC film as described in Patent Document 2, the silicon dioxide film forming apparatus for forming a silicon dioxide film as described in Patent Document 3, or the chromium plating apparatus as described in Patent Document 1 is applicable.

Further, it is more preferred that the processing apparatus be a two-stage processing apparatus including two processing apparatus arranged vertically. With this configuration, more processing apparatus can be arranged in the turnable range of the robotic arm.

It is preferred that one of the two processing apparatus which is arranged on a lower stage of the two-stage processing apparatus include a roll loading and unloading opening portion in a top surface of the one of the two processing apparatus so that a robotic arm is allowed to enter through the top surface of the one of the two processing apparatus.

It is preferred that one of the two processing apparatus which is arranged on an upper stage of the two-stage processing apparatus include a roll loading and unloading opening portion in a side surface facing corresponding one of the first industrial robot and the second industrial robot so that a robotic arm is allowed to enter through the side surface of the one of the two processing apparatus.

Effects of the Invention

The present invention has a remarkable effect of providing the fully automatic gravure plate-making processing system capable of manufacturing a gravure plate-making roll more quickly as compared to the conventional case, achieving space saving, performing an unattended operation even in the nighttime, and reducing dust between the individual processes.

Further, there is no need to employ the conventional cassette-type roll chuck rotary transportation unit and the like. Thus, space saving can be achieved as a matter of course, and further, there are produced such effects that the rotation accuracy of the unprocessed plate-making roll is improved and that the sealability of the unprocessed plate-making roll is improved when the unprocessed plate-making roll is set onto the processing apparatus.

MODES FOR CARRYING OUT THE INVENTION

In the following, embodiments of the present invention are described. However, these embodiments are described for illustrative purposes. Therefore, it is understood that various modifications can be made thereto within the scope of the technical idea of the present invention.

Figure 1:
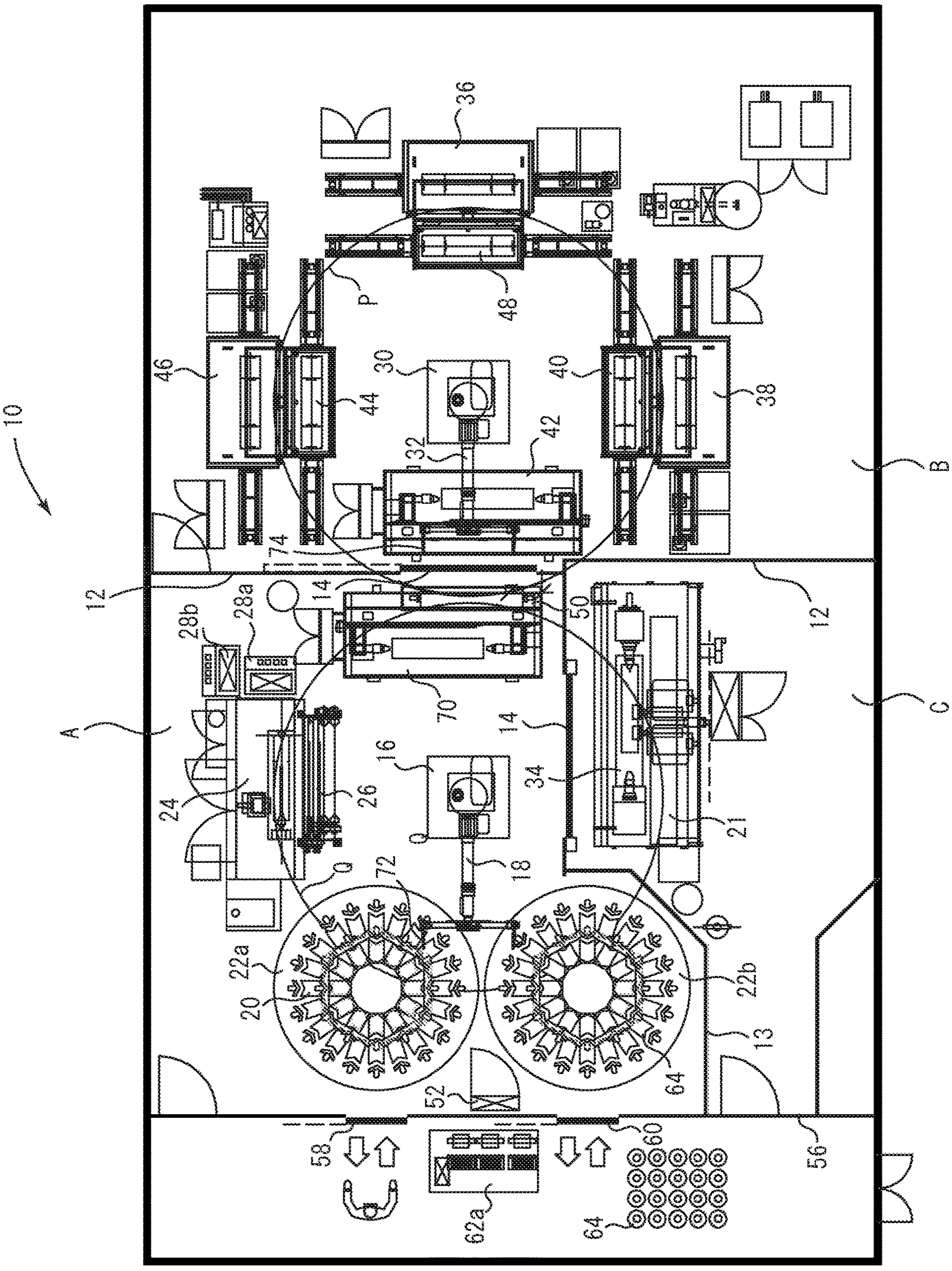
FIG. 1 is a schematic plan view illustrating a fully automatic gravure plate-making processing system according to an embodiment of the present invention.

A fully automatic gravure plate-making processing system for a gravure plate-making roll according to the present invention is described with reference to the accompanying drawings. In FIG. 1, reference symbol 10 represents the fully automatic gravure plate-making processing system for a gravure plate-making roll according to the present invention. The fully automatic gravure plate-making processing system 10 includes a processing room-A, a processing room-B, and a processing room-C. The processing room-A and the processing room-B are partitioned by a wall 12, and the processing room-A and the processing room-C are partitioned by a wall 13. Further, the processing room-A and the processing room-B, and the processing room-A and the processing room-C are communicable to each other via openable and closable shutters 14, respectively.

A configuration of the processing room-A is described. In the processing room-A, reference symbol 16 represents a first industrial robot, which includes a turnable multi-axis robotic arm 18. The first industrial robot 16 is controlled by operating a control panel 28*a* for an industrial robot. Reference symbol Q represents a turnable range of the robotic arm 18, which corresponds to a handling area of the first industrial robot 16.

Reference symbol 20 represents an unprocessed plate-making roll, and reference symbols 22*a* and 22*b* represent roll stock apparatus, respectively. As the roll stock apparatus, for example, the roll stock apparatus disclosed in Patent Documents 4 to 6 may be used.

Chuck means 72 is provided at a distal end of the robotic arm 18. The chuck means 72 is capable of releasably chucking the unprocessed plate-making roll 20.

Reference symbol 24 represents a photosensitive film coating apparatus, and reference symbol 26 represents a laser exposure apparatus. In the example of FIG. 1, the photosensitive film coating apparatus 24 is provided above the laser exposure apparatus 26. As those apparatus, conventionally known apparatus are applicable, and for example, the photosensitive film coating apparatus and the laser exposure apparatus as disclosed in Patent Documents 4 to 6 may be used.

Reference symbol 50 represents a roll transfer placement table, on which the unprocessed plate-making roll 20 is placeable for transfer. The roll transfer placement table 50 is provided at a position at which the handling area Q of the first industrial robot 16 overlaps with a handling area of second industrial robot 30. Reference symbol 70 represents an ultrasonic cleaning apparatus with a drying function, which is configured to perform ultrasonic cleaning processing and drying processing for the unprocessed plate-making roll 20. The ultrasonic cleaning apparatus 70 with a drying function is provided in proximity to the roll transfer placement table 50.

The ultrasonic cleaning apparatus 70 includes a reservoir for storing cleaning water, and an ultrasonic transducer provided below the reservoir. The ultrasonic cleaning apparatus 70 is capable of performing cleaning by vibrating the cleaning water through ultrasonic vibration of the ultrasonic transducer. A drying function is further provided to the ultrasonic cleaning apparatus 70 with a drying function. The ultrasonic cleaning apparatus 70 with a drying function is capable of performing ultrasonic cleaning and drying for each processing as necessary.

Further, in the processing room-A, a main control panel 52 is provided so as to control the fully automatic gravure plate-making processing system 10.

Next, a configuration of the processing room-B is described. In the processing room-B, reference symbol 30 represents a second industrial robot, which includes a turnable multi-axis robotic arm 32. The second industrial robot 30 is controlled by operating a control panel 28*b* for an industrial robot. Reference symbol P represents a turnable range of the robotic arm 32, which corresponds to a handling area of the second industrial robot 30.

Chuck means 74 is provided at a distal end of the robotic arm 32. The chuck means 74 is capable of releasably chucking the unprocessed plate-making roll 20.

Reference symbol 42 represents a developing apparatus, and for example, the developing apparatus as disclosed in Patent Documents 4 to 6 may be used.

Reference symbol 38 represents a degreasing apparatus, and reference symbol 40 represents a copper plating apparatus. In the example of FIG. 1, the degreasing apparatus 38 is provided above the copper plating apparatus 40. As those apparatus, conventionally known apparatus are applicable, and for example, the degreasing apparatus and the copper plating apparatus as disclosed in Patent Documents 4 to 6 may be used.

Reference symbol 44 represents an etching apparatus, and reference symbol 46 represents a resist removal apparatus. In the example of FIG. 1, the resist removal apparatus 46 is provided above the etching apparatus 44. As those apparatus, conventionally known apparatus are applicable, and for example, the etching apparatus and the resist removal apparatus as disclosed in Patent Documents 4 to 6 may be used.

Reference symbol 48 represents a chromium plating apparatus, and reference symbol 36 represents an ultrasonic cleaning apparatus. As the chromium plating apparatus, a conventionally known apparatus may be used, and for example, the chromium plating apparatus as disclosed in Patent Document 1 may be used. Further, in the example of FIG. 1, the chromium plating apparatus is used as an example of a surface hardening film forming apparatus, but alternatively, a DLC film forming apparatus or a silicon dioxide film forming apparatus is applicable as the surface hardening film forming apparatus. As the DLC film forming apparatus, for example, the DLC film forming apparatus as described in Patent Document 2 may be used, and as the silicon dioxide film forming apparatus, for example, the silicon dioxide film forming apparatus as described in Patent Document 3 may be used.

Further, the ultrasonic cleaning apparatus 36 includes a reservoir for storing cleaning water, and an ultrasonic transducer provided below the reservoir. The ultrasonic cleaning apparatus 36 is capable of performing cleaning by vibrating the cleaning water through ultrasonic vibration of the ultrasonic transducer.

Next, a configuration of the processing room-C is described. In the processing room-C, reference symbol 21 represents a paper polishing apparatus for performing paper polishing, and reference symbol 34 represents a grinding wheel polishing apparatus. As the grinding wheel polishing apparatus 34, a conventionally known apparatus is applicable, and for example, the grinding wheel polishing apparatus as disclosed in Patent Documents 4 to 6 may be used. In the example of FIG. 1, the paper polishing apparatus 21 is provided above the grinding wheel polishing apparatus 34. As the paper polishing apparatus 21, for example, the paper polishing apparatus as disclosed in Patent Documents 4 to 6 may be used.

The processing room-A and the processing room-C are communicable to each other via the shutter 14, and hence the grinding wheel polishing apparatus 34 and the paper polishing apparatus 21 are arranged in the handling area of the first industrial robot 16.

In the example of FIG. 1, the processing room-A is arranged as a clean room. The processing room-A and the processing room-B may be arranged as clean rooms, respectively, as necessary.

Doors 58 and 60 are provided on a wall 56 of the processing room-A, through which a processed plate-making roll is carried outside and a unprocessed plate-making roll (plate-making base material) is newly carried inside. The processed plate-making roll is placed on any one of the roll stock apparatus 22*a* and 22*b*, and the unprocessed plate-making roll is placed on the other roll stock apparatus. A computer 62 is installed outside the processing room-A so as to check and manage various kinds of information, and to perform settings for various kinds of programs. Reference symbol 64 represents a processed plate-making roll that is manufactured.

In the example of FIG. 1, the unprocessed plate-making roll 20 is placed on the roll stock apparatus 22*a*, and the processed plate-making roll 64 is placed on the roll stock apparatus 22*b*.

As described above, the fully automatic gravure plate-making processing system 10 according to the present invention includes: the first industrial robot 16; the second industrial robot 30; the roll stock apparatus 22*a* and 22*b*, the photosensitive film coating apparatus 24, the laser exposure apparatus 26, the ultrasonic cleaning apparatus 70 with a drying function, the grinding wheel polishing apparatus 34, and the paper polishing apparatus 21, which are arranged in the handling area of the first industrial robot 16; and the degreasing apparatus 38, the copper plating apparatus 40, the developing apparatus 42, the etching apparatus 44, the resist removal apparatus 46, the chromium plating apparatus 48 as the surface hardening film forming apparatus, and the ultrasonic cleaning apparatus 36, which are arranged in the handling area of the second industrial robot 30. The first industrial robot 16 and the second industrial robot 30 are configured to transfer the unprocessed plate-making roll therebetween to perform plate-making processing.

Note that, a single apparatus may serve as both the copper plating apparatus 40 and the chromium plating apparatus 48 to perform copper plating and chromium plating through only the replacement of the plating solution.

More specifically, in the example of FIG. 1, the fully automatic gravure plate-making processing system further includes the roll transfer placement table 50 provided at the position at which the handling area of the first industrial robot 16 overlaps with the handling area of the second industrial robot 30. The ultrasonic cleaning apparatus 70 with a drying function is provided in proximity to the roll transfer placement table 50. In the handling area of the first industrial robot 16, the grinding wheel polishing apparatus 34 and the paper polishing apparatus 21, the roll stock apparatus 22*a* and 22*b*, and the photosensitive film coating apparatus 24 and the laser exposure apparatus 26 are arranged in this order clockwise with respect to a position of the ultrasonic cleaning apparatus 70 with a drying function. The developing apparatus 42 is provided in proximity to the roll transfer placement table 50. In the handling area of the second industrial robot 30, the etching apparatus 44 and the resist removal apparatus 46, the chromium plating apparatus 48 as the surface hardening film forming apparatus and the ultrasonic cleaning apparatus 36, and the copper plating apparatus 40 and the degreasing apparatus 38 are arranged in this order clockwise with respect to a position of the developing apparatus 42. The first industrial robot 16 and the second industrial robot 30 are configured to transfer the unprocessed plate-making roll therebetween to perform the plate-making processing.

Referring to FIG. 1, actions of the fully automatic gravure plate-making processing system according to the present invention are described. The first industrial robot 16 chucks the unprocessed plate-making roll 20, which is placed on any one of the roll stock apparatus 22*a* and 22*b*, and places the unprocessed plate-making roll 20 on the roll transfer placement table 50 so that the unprocessed plate-making roll 20 is transferred to the second industrial robot 30. The second industrial robot 30 chucks the unprocessed plate-making roll 20, and transports the unprocessed plate-making roll 20 to the degreasing apparatus 38. Then, the second industrial robot 30 releases the unprocessed plate-making roll 20, and sets the unprocessed plate-making roll 20 onto the degreasing apparatus 38.

When a degreasing work is finished at the degreasing apparatus 38, the second industrial robot 30 chucks the plate-making roll 20, and transports the unprocessed plate-making roll 20 to the copper plating apparatus 40. Then, the second industrial robot 30 releases the unprocessed plate-making roll 20, and sets the unprocessed plate-making roll 20 onto the copper plating apparatus 40.

When a plating work is finished at the copper plating apparatus 40, the second industrial robot 30 chucks the unprocessed plate-making roll 20, and transports and places the unprocessed plate-making roll 20 onto the roll transfer placement table 50 so that the unprocessed plate-making roll 20 is transferred to the first industrial robot 16. The first industrial robot 16 chucks the unprocessed plate-making roll 20, and transports the unprocessed plate-making roll 20 to the grinding wheel polishing apparatus 34. Then, the first industrial robot 16 releases the unprocessed plate-making roll 20, and sets the unprocessed plate-making roll 20 onto the grinding wheel polishing apparatus 34.

When a grinding wheel polishing work is finished at the grinding wheel polishing apparatus 34, the first industrial robot 16 chucks the unprocessed plate-making roll 20, and transports the unprocessed plate-making roll 20 to the ultrasonic cleaning apparatus 70. Then, the first industrial robot 16 releases the unprocessed plate-making roll 20, and sets the unprocessed plate-making roll 20 onto the ultrasonic cleaning apparatus 70.

When an ultrasonic cleaning work is finished at the ultrasonic cleaning apparatus 70, the first industrial robot 16 chucks the unprocessed plate-making roll 20, and transports the unprocessed plate-making roll 20 to the photosensitive film coating apparatus 24. Then, the first industrial robot 16 releases the unprocessed plate-making roll 20, and sets the unprocessed plate-making roll 20 onto the photosensitive film coating apparatus 24.

When a photosensitive film coating work is finished at the photosensitive film coating apparatus 24, the first industrial robot 16 chucks the unprocessed plate-making roll 20, and transports the unprocessed plate-making roll 20 to the laser exposure apparatus 26. Then, the first industrial robot 16 releases the unprocessed plate-making roll 20, and sets the unprocessed plate-making roll 20 onto the laser exposure apparatus 26.

When an exposure work is finished at the laser exposure apparatus 26, the first industrial robot 16 chucks the unprocessed plate-making roll 20, and places the unprocessed plate-making roll 20 onto the roll transfer placement table 50 so that the unprocessed plate-making roll 20 is transferred to the second industrial robot 30. The second industrial robot 30 chucks the unprocessed plate-making roll 20, and transports the unprocessed plate-making roll 20 to the developing apparatus 42. Then, the second industrial robot 30 releases the unprocessed plate-making roll 20, and sets the unprocessed plate-making roll 20 onto the developing apparatus 42.

When a developing work is finished at the developing apparatus 42, the second industrial robot 30 chucks the unprocessed plate-making roll 20, and transports the unprocessed plate-making roll 20 to the etching apparatus 44. Then, the second industrial robot 30 releases the unprocessed plate-making roll 20, and sets the unprocessed plate-making roll 20 onto the etching apparatus 44.

When an etching work is finished at the etching apparatus 44, the second industrial robot 30 chucks the unprocessed plate-making roll 20, and transports the unprocessed plate-making roll 20 to the resist removal apparatus 46. Then, the second industrial robot 30 releases the unprocessed plate-making roll 20, and sets the unprocessed plate-making roll 20 onto the resist removal apparatus 46.

When a resist removal work is finished at the resist removal apparatus 46, the second industrial robot 30 chucks the unprocessed plate-making roll 20, and transports the unprocessed plate-making roll 20 to the ultrasonic cleaning apparatus 36. Then, the second industrial robot 30 releases the unprocessed plate-making roll 20, and sets the unprocessed plate-making roll 20 onto the ultrasonic cleaning apparatus 36.

When an ultrasonic cleaning work is finished at the ultrasonic cleaning apparatus 36, the second industrial robot 30 chucks the unprocessed plate-making roll 20, and transports the unprocessed plate-making roll 20 to the chromium plating apparatus 48. Then, the second industrial robot 30 releases the unprocessed plate-making roll 20, and sets the unprocessed plate-making roll 20 onto the chromium plating apparatus 48. Then, chromium plating is performed at the chromium plating apparatus 48. Note that, the unprocessed plate-making roll 20 is washed and dried for each processing as necessary at the ultrasonic cleaning apparatus 70 with a drying function.

When a plating work is finished at the chromium plating apparatus 48, the second industrial robot 30 chucks the unprocessed plate-making roll 20, and places the unprocessed plate-making roll 20 onto the roll transfer placement table 50 so that the unprocessed plate-making roll 20 is transferred to the first industrial robot 16. The first industrial robot 16 chucks the unprocessed plate-making roll 20, and transports the unprocessed plate-making roll 20 to the paper polishing apparatus 21. Then, the first industrial robot 16 releases the unprocessed plate-making roll 20, and sets the unprocessed plate-making roll 20 onto the paper polishing apparatus 21. When paper polishing (automatic polishing) is performed at the paper polishing apparatus 21, the processed plate-making roll 64 is obtained and, in the example of FIG. 1, placed on the roll stock apparatus 22*b*.

The processed plate-making roll 64 thus obtained is carried outside the processing room-A as a final product.

In the example of FIG. 1, as each of the first industrial robot 16 and the second industrial robot 30, the industrial robot as disclosed in Patent Documents 1 to 6 is used for transporting the unprocessed plate-making roll 20 to each processing apparatus, and releasing and setting the unprocessed plate-making roll 20 onto the processing apparatus. Then, the unprocessed plate-making roll is rotated by drive means provided in the processing apparatus.

On the other hand, there may be employed the following configuration. That is, as each of the first industrial robot and the second industrial robot, the industrial robot including drive means as disclosed in Patent Document 7 is used for transporting the unprocessed plate-making roll 20 to each processing apparatus, and setting the unprocessed plate-making roll 20 onto the processing apparatus while gripping the unprocessed plate-making roll 20. Then, the unprocessed plate-making roll is rotated by the drive means provided in the industrial robot.

Further, it is preferred, as necessary, that each processing apparatus of the fully automatic gravure plate-making processing system 10 be a two-stage processing apparatus including two processing apparatus arranged vertically. With this configuration, more processing apparatus can be arranged in the turnable range of the robotic arm.

Figure 2:
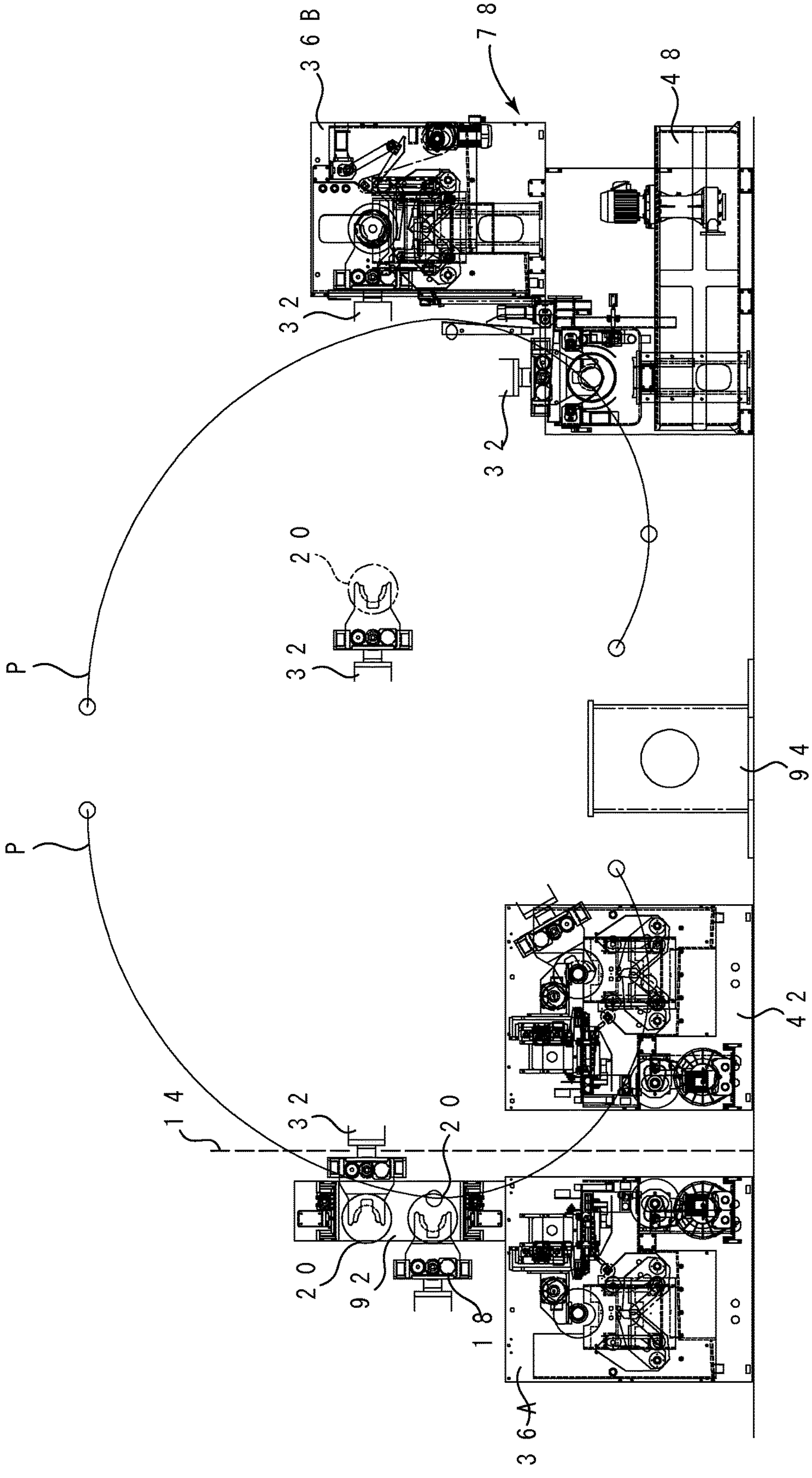
FIG. 2 is a schematic view illustrating an example in which a two-stage processing apparatus is applied to the fully automatic plate-making system.
Figure 3:
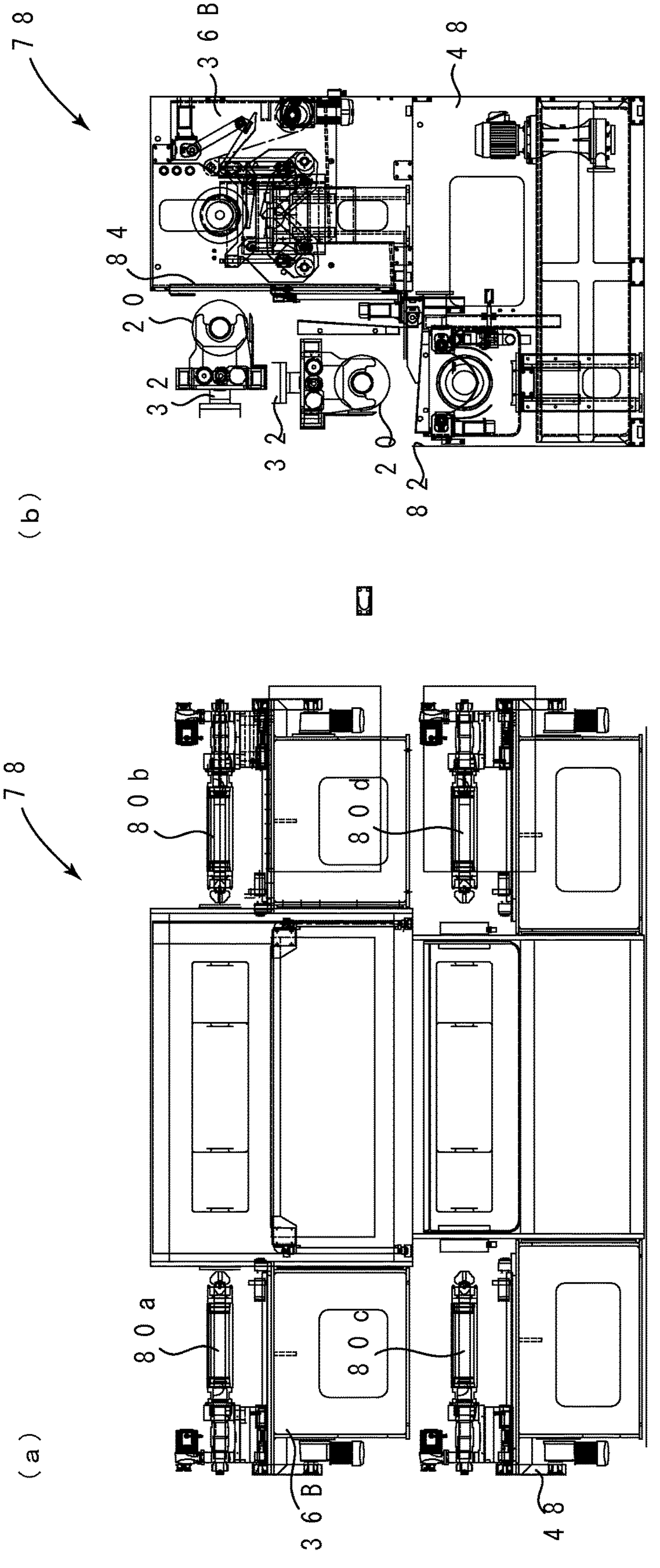
FIG. 3 are schematic views illustrating an example of the two-stage processing apparatus of the fully automatic plate-making system. Specifically, FIG. 3(*a*) is a front view and FIG. 3(*b*) is a side view.

FIGS. 2 and 3 illustrate an example of the two-stage processing apparatus. Similarly to the fully automatic gravure plate-making processing system 10 illustrated in FIG. 1, the two-stage processing apparatus illustrated in FIGS. 2 and 3 is arranged in the turnable range Q of the robotic arm 18 of the first industrial robot 16 in the zone-A or the turnable range P of the robotic arm 32 of the second industrial robot 30 in the zone-B.

In FIG. 2, reference symbol 36A represents a first ultrasonic cleaning apparatus, which is arranged in the turnable range Q of the robotic arm 18 of the first industrial robot 16 in the zone-A. Above the ultrasonic cleaning apparatus 36A, there is provided a two-stage roll transfer placement table 92 including two roll gripping means arranged vertically.

In the two-stage roll transfer placement table 92, roll chuck means for gripping the unprocessed plate-making roll 20 are arranged vertically, and as illustrated in FIG. 2, capable of receiving two unprocessed plate-making rolls on upper and lower sides thereof.

The unprocessed plate-making roll 20 is transported from the robotic arm 18 of the first industrial robot 16 in the zone-A to the lower roll chuck means of the two-stage roll transfer placement table 92.

The unprocessed plate-making roll 20 is transported from the robotic arm 32 of the second industrial robot 30 in the zone-B to the upper roll chuck means of the two-stage roll transfer placement table 92.

Thus, the two-stage roll transfer placement table 92 includes a lower side-surface opening portion, through which the unprocessed plate-making roll 20 is transported from the robotic arm 18 of the first industrial robot 16 in the zone-A, and an upper side-surface opening portion, through which the plate-making roll 20 is transported from the robotic arm 32 of the second industrial robot 30 in the zone-B.

Reference symbol 14 represents a shutter, and the developing apparatus 42 is arranged in the zone-B across the shutter. Reference symbol 94 represents a mounting table for the second industrial robot 30 in the zone-B.

In the turnable range P of the robotic arm 32 of the second industrial robot 30 in the zone-B, a second ultrasonic cleaning apparatus 36B is mounted on the chromium plating apparatus 48, thereby constituting a two-stage processing apparatus 78. The unprocessed plate-making roll 20 is transported for processing from the robotic arm 32 of the second industrial robot 30 in the zone-B to each of the chromium plating apparatus 48 on the lower stage and the second ultrasonic cleaning apparatus 36B on the upper stage.

It is preferred that, in the two-stage processing apparatus, a processing apparatus which is relatively large in amount of a solution to be used be arranged on the lower stage, and a processing apparatus which is relatively small in amount of a solution to be used be arranged on the upper stage.

For example, it is preferred that the two-stage processing apparatus includes the copper plating apparatus arranged on the lower stage, and the degreasing apparatus arranged on the upper stage.

For example, it is preferred that the two-stage processing apparatus includes the etching apparatus arranged on the lower stage, and the resist removal apparatus arranged on the upper stage.

For example, it is preferred that the two-stage processing apparatus includes the chromium plating apparatus arranged on the lower stage, and the ultrasonic cleaning apparatus arranged on the upper stage.

In FIG. 3, reference symbol 78 represents a two-stage processing apparatus. In the example of FIG. 3, the two-stage processing apparatus 78 includes the chromium plating apparatus 48 as the processing apparatus on the lower stage, and the second ultrasonic cleaning apparatus 36B as the processing apparatus on the upper stage. Reference symbols 80*a* to 80*d* represent roll chuck members for chucking and gripping the unprocessed plate-making roll 20. The basic configuration of those processing apparatus is known as disclosed in, for example, Patent Documents 1 to 3. However, in the case of the two-stage processing apparatus 78, the two-stage arrangement is employed unlike the conventional processing apparatus, and further, roll loading and unloading opening portions for loading and unloading the unprocessed plate-making roll are uniquely provided for a robotic hand.

The chromium plating apparatus 48 arranged on the lower stage of the two-stage processing apparatus 78 includes a roll loading and unloading opening portion 82 in a top surface of the chromium plating apparatus 48 so that the robotic arm 32 is allowed to enter through the top surface of the apparatus.

The second ultrasonic cleaning apparatus 36B arranged on the upper stage of the two-stage processing apparatus 78 includes a roll loading and unloading opening portion 84 in a side surface facing the second industrial robot 30 so that the robotic arm 32 is allowed to enter through the side surface of the apparatus.

Further, shutter members are provided to the roll loading and unloading opening portions 82 and 84, respectively, and are automatically opened when the robotic arm 32 transports the unprocessed plate-making roll 20. When the roll chuck members 80*a* to 80*d* chuck the unprocessed plate-making roll and the robotic arm 32 exits from the two-stage processing apparatus 78 to the outside, the shutter members are closed to prevent the entrance of dust, dirt, and the like.

With this configuration, various processing apparatus can be arranged in the handling area of the industrial robot, and hence there is an advantage in that the space for those processing apparatus is approximately halved as compared to the conventional fully automatic plate-making system described in, for example, Patent Documents 1 to 3. Further, there is an advantage in that the power consumption is approximately halved as compared to the conventional fully automatic plate-making system described in, for example, Patent Document 1.

REFERENCE SIGNS LIST

10: fully automatic gravure plate-making processing system, 12, 13: wall, 14: shutter, 16: first industrial robot, 18, 32: robotic arm, 20: unprocessed plate-making roll, 21: paper polishing apparatus, 22*a*, 22*b*: roll stock apparatus, 24: photosensitive film coating apparatus, 26: laser exposure apparatus, 28*a*, 28*b*: control panel for industrial robot, 30: second industrial robot, 34: grinding wheel polishing apparatus, 36, 36A, 36B: ultrasonic cleaning apparatus, 38: degreasing apparatus, 40: copper plating apparatus, 42: developing apparatus, 44: etching apparatus, 46: resist removal apparatus, 48: chromium plating apparatus, 50: roll transfer placement table, 52: main control panel, 56: wall, 58, 60: door, 62: computer, 64: processed plate-making roll, 70: ultrasonic cleaning apparatus with drying function, 72, 74: chuck means, 78: two-stage processing apparatus, 80*a* to 80*d*: roll chuck member, 82, 84: roll loading and unloading opening portion, 92: two-stage roll transfer placement table, 94: mounting table, A, B, C: processing room, P, Q: turnable range.

The invention claimed is:

1. A fully automatic gravure plate-making processing system, comprising:

- a first industrial robot for chucking and handling an unprocessed plate-making roll, said first industrial robot comprising a first industrial robotic arm;
- a second industrial robot for chucking and handling the unprocessed plate-making roll, said second industrial robot comprising a second industrial robotic arm;
- a roll stock apparatus, a photosensitive film coating apparatus, a laser exposure apparatus, an ultrasonic cleaning apparatus with a drying function, a grinding wheel polishing apparatus, and a paper polishing apparatus, which serve as processing apparatus arranged in a first robot working range of the first industrial robot, said first robot working range being defined by said first industrial robotic arm, wherein at least a portion of each of said roll stock apparatus, said photosensitive film coating apparatus, said laser exposure apparatus, said ultrasonic cleaning apparatus, said grinding wheel polishing apparatus, and said paper polishing apparatus overlaps with said first robot working range; and a degreasing apparatus, a copper plating apparatus, a developing apparatus, an etching apparatus, a resist removal apparatus, a surface hardening film forming apparatus, and an ultrasonic cleaning apparatus, which serve as processing apparatus arranged in a second robot working range of the second industrial robot, said second robot working range being defined by said second industrial robotic arm, wherein at least a portion of each of said copper plating apparatus, said developing apparatus, said etching apparatus, said resist removal apparatus, said surface hardening film forming apparatus and said ultrasonic cleaning apparatus overlaps with said second robot working range;
- a roll transfer placement table provided at a position at which the robot working range of the first industrial robot overlaps with the robot working range of the second industrial robot, wherein the first industrial robot and the second industrial robot are configured to transfer the unprocessed plate-making roll therebetween via the same roll transfer placement table when the preparation processing is performed, wherein the roll transfer placement table is arranged in one of a first processing room and a second processing room.

2. A fully automatic gravure plate-making processing system according to claim 1, wherein:

- a movable closing structure is provided between the first processing room and the second processing room;
- an opening is provided between the first processing room and the second processing room when the movable closing structure is in an open position;
- the ultrasonic cleaning apparatus with the drying function is provided in proximity to the roll transfer placement table;
- in the robot working range of the first industrial robot, the grinding wheel polishing apparatus and the paper polishing apparatus, the roll stock apparatus, and the photosensitive film coating apparatus and the laser exposure apparatus are arranged in this order clockwise with respect to a position of the ultrasonic cleaning apparatus with the drying function;
- the developing apparatus is provided in proximity to the roll transfer placement table;
- in the robot working range of the second industrial robot, the etching apparatus and the resist removal apparatus, the surface hardening film forming apparatus and the ultrasonic cleaning apparatus, and the copper plating apparatus and the degreasing apparatus are arranged in this order clockwise with respect to a position of the developing apparatus; and
- the first industrial robot and the second industrial robot are configured to transfer the unprocessed plate-making roll therebetween, to thereby perform the plate-making processing.

3. A fully automatic gravure plate-making processing system according to claim 1, further comprising:

- a movable closing structure provided between the first processing room and the second processing room, the first industrial robot being located on one side of the movable closing structure, the second industrial robot being located on another side of the movable closing structure, wherein the surface hardening film forming apparatus comprises a chromium plating apparatus, a DLC film forming apparatus, or a silicon dioxide film forming apparatus.

4. A fully automatic gravure plate-making processing system according to claim 1, wherein at least one of the processing apparatus arranged in said robot working range of the first industrial robot and the processing apparatus arranged in said robot working range of the second industrial robot comprise a two-stage processing apparatus including two processing apparatus arranged vertically.

5. A fully automatic gravure plate-making processing system according to claim 4, wherein one of the two processing apparatus which is arranged on a lower stage of the two-stage processing apparatus comprises a roll loading and unloading opening portion in a top surface of the one of the two processing apparatus so that a robotic arm is allowed to enter through the top surface of the one of the two processing apparatus.

6. A fully automatic gravure plate-making processing system according to claim 4, wherein one of the two processing apparatus which is arranged on an upper stage of the two-stage processing apparatus comprises a roll loading and unloading opening portion in a side surface facing corresponding one of the first industrial robot and the second industrial robot so that a robotic arm is allowed to enter through the side surface of the one of the two processing apparatus.

7. A fully automatic gravure plate-making processing system according to claim 2, wherein the surface hardening film forming apparatus comprises a chromium plating apparatus, a DLC film forming apparatus, or a silicon dioxide film forming apparatus.

8. A fully automatic gravure preparation processing system according to claim 1, wherein the first industrial robot is arranged in a first processing room, the second industrial robot being arranged in a second processing room, wherein one of the first processing room and the second processing room comprises the roll transfer placement table.

9. A fully automatic gravure plate-making processing system, comprising:

a first industrial robot comprising a first industrial robot arm for chucking and handling an unprocessed plate-making roll, said first industrial robot being arranged in a first processing room, said first industrial robot comprising a first industrial robot working range, said first industrial robot working range being defined by a range of movement of said first industrial robot arm;

a second industrial robot comprising a second industrial robot arm for chucking and handling the unprocessed plate-making roll, said second industrial robot being arranged in a second processing room, said second industrial robot comprising a second industrial robot working range, said second industrial robot working range being defined by a range of movement said second industrial robot arm, wherein at least a portion of said first industrial robot working range is located adjacent to at least a portion of said second industrial robot working range, wherein the first industrial robot and the second industrial robot move the unprocessed plate-making roll;

a roll stock apparatus;

a photosensitive film coating apparatus;

a laser exposure apparatus;

an ultrasonic cleaning apparatus with a drying function;

a grinding wheel polishing apparatus;

a paper polishing apparatus, at least a portion of each of said roll stock apparatus, said photosensitive film coating apparatus, said laser exposure apparatus, said ultrasonic cleaning apparatus, said grinding wheel polishing apparatus and said paper polishing apparatus being arranged in said first industrial robot working range, whereby said at least said portion of each of said roll stock apparatus, said photosensitive film coating apparatus, said laser exposure apparatus, said ultrasonic cleaning apparatus, said grinding wheel polishing apparatus and said paper polishing apparatus is arranged in said range of movement of said first industrial robot arm;

a degreasing apparatus;

a copper plating apparatus;

a developing apparatus;

an etching apparatus;

a resist removal apparatus;

a surface hardening film forming apparatus;

an ultrasonic cleaning apparatus, at least a portion of said degreasing apparatus, said copper plating apparatus, said developing apparatus, said etching apparatus, said resist removal apparatus, said surface hardening film forming apparatus and said ultrasonic cleaning apparatus being arranged in said second industrial robot working range, whereby said at least said portion of said degreasing apparatus, said copper plating apparatus, said developing apparatus, said etching apparatus, said resist removal apparatus, said surface hardening film forming apparatus and said ultrasonic cleaning apparatus is located within said range of movement of said second industrial robot arm;

a roll transfer placement table provided at a position at which the first industrial robot working range overlaps with the second industrial robot working range, the roll transfer placement table being arranged in one of the first processing room and the second processing room, wherein the first industrial robot and the second industrial robot are configured to transfer the unprocessed plate-making roll therebetween via the same roll transfer placement table when the preparation processing is performed.

10. A fully automatic gravure plate-making processing system according to claim 9, wherein only the first industrial robot moves the unprocessed plate-making roll between said roll stock apparatus, said photosensitive film coating apparatus, said laser exposure apparatus, said ultrasonic cleaning apparatus, said grinding wheel polishing apparatus and said paper polishing apparatus, said roll transfer placement table and only said second industrial robot moves the unprocessed plate-making roll between said degreasing apparatus, said copper plating apparatus, said developing apparatus, said etching apparatus, said resist removal apparatus, said surface hardening film forming apparatus, said roll transfer placement table and said ultrasonic cleaning apparatus.

11. A fully automatic gravure plate-making processing system according to claim 10, wherein:

said roll transfer placement table overlaps at least a portion of said first industrial robot working range and at least a portion of said second industrial robot working range, said at least said portion of said second industrial robot working range being located opposite said at least said portion of said second industrial robot working range;

the ultrasonic cleaning apparatus with the drying function is provided in proximity to the roll transfer placement table;

in the robot working range of the first industrial robot, the grinding wheel polishing apparatus and the paper polishing apparatus, the roll stock apparatus, and the photosensitive film coating apparatus and the laser exposure apparatus are arranged in this order clockwise with respect to a position of the ultrasonic cleaning apparatus with the drying function;

the developing apparatus is provided in proximity to the roll transfer placement table;

in the robot working range of the second industrial robot, the etching apparatus and the resist removal apparatus, the surface hardening film forming apparatus and the ultrasonic cleaning apparatus, and the copper plating apparatus and the degreasing apparatus are arranged in this order clockwise with respect to a position of the developing apparatus; and the first industrial robot and the second industrial robot are configured to transfer the unprocessed plate-making roll therebetween, to thereby perform the plate-making processing.

12. A fully automatic gravure plate-making processing system according to claim 10, wherein the surface hardening film forming apparatus comprises a chromium plating apparatus, a DLC film forming apparatus, or a silicon dioxide film forming apparatus.

13. A fully automatic gravure plate-making processing system according to claim 10, wherein at least one of the processing apparatus arranged in said first industrial robot working range and the processing apparatus arranged in said second industrial robot working range comprise a two-stage processing apparatus including two processing apparatus arranged vertically.

14. A fully automatic gravure plate-making processing system according to claim 13, wherein one of the two processing apparatus which is arranged on a lower stage of the two-stage processing apparatus comprises a roll loading and unloading opening portion in a top surface of the one of the two processing apparatus so that one of said first industrial robot arm and said second industrial robot arm is allowed to enter through the top surface of the one of the two processing apparatus.

15. A fully automatic gravure plate-making processing system according to claim 13, wherein one of the two processing apparatus which is arranged on an upper stage of the two-stage processing apparatus comprises a roll loading and unloading opening portion in a side surface facing corresponding one of the first industrial robot and the second industrial robot so that one of said first industrial robot arm and said second industrial robot arm is allowed to enter through the side surface of the one of the two processing apparatus.

16. A fully automatic gravure plate-making processing system according to claim 11, wherein the surface hardening film forming apparatus comprises a chromium plating apparatus, a DLC film forming apparatus, or a silicon dioxide film forming apparatus.

17. A fully automatic gravure preparation processing system according to claim 10, wherein a movable closing structure is provided between the first processing and the second processing room, wherein an opening is provided between the first processing room and the second processing room when the movable closing structure is in a retracted position.

18. A fully automatic gravure preparation processing system according to claim 10, wherein a portion of said first industrial robot working range overlaps a portion of said second industrial robot working range, said first processing room being separated from said second processing room via at least a movable closing structure, said first industrial robot being located on one side of said movable closing structure, said second industrial robot being located on another side of said movable closing structure.

19. A fully automatic gravure plate-making processing system, comprising:

a first industrial robot comprising a first industrial robotic arm for chucking and handling at least one unprocessed plate-making roll, said first industrial robot comprising a first industrial robot working range, said first industrial robot working range being defined by a path of movement of said first industrial robotic arm;

a second industrial robot comprising a second industrial robotic arm for chucking and handling the at least one unprocessed plate-making roll, said second industrial robot comprising a second industrial robot working range, said second industrial robot working range being defined by a path of movement of said second industrial robotic arm, at least a portion of said first industrial robot working range intersecting at least a portion of said second industrial robot working range, wherein the at least one unprocessed plate-making roll is moved exclusively by said first industrial robot and said second industrial robot;

a first processing apparatus, at least a portion of each of said first processing apparatus being arranged in said first industrial robot working range, said first processing apparatus comprising a roll stock apparatus, a photosensitive film coating apparatus, a laser exposure apparatus, an ultrasonic cleaning apparatus with a drying function, a grinding wheel polishing apparatus and a paper polishing apparatus, wherein at least a portion of each of said roll stock apparatus, said photosensitive film coating apparatus, said laser exposure apparatus, said ultrasonic cleaning apparatus, said grinding wheel polishing apparatus and said paper polishing apparatus is located within said path of movement of said first industrial robotic arm;

a second processing apparatus, at least a portion of each of said second processing apparatus being arranged in said second robot working range, said second processing apparatus comprising a degreasing apparatus, a copper plating apparatus, a developing apparatus, an etching apparatus, a resist removal apparatus, a surface hardening film forming apparatus and an ultrasonic cleaning apparatus, wherein said at least said portion of each of said degreasing apparatus, said copper plating apparatus, said developing apparatus, said etching apparatus, said resist removal apparatus, said surface hardening film forming apparatus and said ultrasonic cleaning apparatus is located within said path of movement of said second industrial robotic arm; and a roll transfer placement table, at least a portion of the roll transfer placement table overlapping with the first robot working range and the second robot working range, the roll transfer placement table being arranged in an interior space of one of a first processing room and a second processing room.

20. A fully automatic gravure preparation processing system according to claim 19, wherein the at least one unprocessed plate-making roll is moved between said roll stock apparatus, said photosensitive film coating apparatus, said laser exposure apparatus, said ultrasonic cleaning apparatus, said grinding wheel polishing apparatus and said paper polishing apparatus exclusively by said first industrial robot and the at least one unprocessed plate-making roll is moved between said degreasing apparatus, said copper plating apparatus, said developing apparatus, said etching apparatus, said resist removal apparatus, said surface hardening film forming apparatus and said ultrasonic cleaning apparatus exclusively by said second industrial robot, the first processing room being separated from the second processing room via at least a movable room dividing structure, the first industrial robot being located on one side of the movable room dividing structure and the second industrial robot being located on another side of the movable room dividing structure.

* * * * *